US006211560B1

United States Patent
Jimenez et al.

(10) Patent No.: US 6,211,560 B1
(45) Date of Patent: Apr. 3, 2001

(54) VOLTAGE TUNABLE SCHOTTKY DIODE PHOTOEMISSIVE INFRARED DETECTOR

(75) Inventors: Jorge R. Jimenez; Paul W. Pellegrini, both of Bedford, MA (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 620 days.

(21) Appl. No.: 08/496,849

(22) Filed: Jun. 16, 1995

(51) Int. Cl.⁷ .................................................. H01L 31/00
(52) U.S. Cl. ............................ 257/451; 257/454; 257/455
(58) Field of Search .................................... 257/451, 452, 257/453, 454, 455

(56) References Cited

U.S. PATENT DOCUMENTS

| | | | |
|---|---|---|---|
| 4,533,933 | 8/1985 | Pellegrini et al. | 357/15 |
| 4,939,561 | * 7/1990 | Yamaka et al. | 257/455 |
| 5,107,317 | 4/1992 | Takasaki | 357/30 |
| 5,163,179 | * 11/1992 | Pellegrini | 257/455 |
| 5,319,204 | 6/1994 | Wong | 250/363.03 |

OTHER PUBLICATIONS

Sze, Physics of semiconductor devices, second edition, Wiley, pp. 249–254, 1981.*
Runyan and Bean, Semiconductor integrated circuit processing technology, Addison–Wesley, pp. 541–543, 1990.*

* cited by examiner

Primary Examiner—Sara Crane
(74) Attorney, Agent, or Firm—William G. Auton

(57) ABSTRACT

PtSi/Si Schottky diode infrared detectors are currently being used in large-area focal plane arrays for imaging in the 3–5 micron atmospheric transmission window. Their photoresponse cuts off at about 6 microns, beyond which they cannot detect infrared ratiation. Because of the nature of Schottky diodes, this cut-off wavelength cannot be adjusted during operation, but is relatively fixed, varying only in proportion of the fourth root of an externally applied bias. This disclosure describes a Schottky diode infrared detector with a voltage-tunable cut-off wavelength. The tunability is obtained by modification of the Schottky diode band diagram by insertion of a SiGe layer, with the appropriate parameters, between the silicide and the Si substrate, making the detector a silicide/SiGe/Si Schottky diode detector. The SiGe/Si interface has a valence band offset that can be used to engineer the shape, or depth profile, of the Schottky barrier. The energy offset can be gradual or abrupt, depending on the grading of the Ge concentration in the SiGe layer. When the offset is abrupt, it can be thought of as an additional, higher energy barrier to photoemitted carriers if the SiGe layer is thin enough. Because this offset, gradual or abrupt, is designed to be deeper in the semiconductor than the normal Schottky barrier maximum, it is easily modified by an external applied voltage. The sensitivity and the range of tunability are defined by the SiGe thickness and Ge concentration, respectively.

5 Claims, 6 Drawing Sheets

VOLTAGE TUNABLE SCHOTTKY DIODE PHOTOEMISSIVE INFRARED DETECTOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to infrared detectors and more specifically the invention pertains to a Schottky diode infrared detector with a voltage tunable cutoff wavelength.

Infrared detectors are used to convert photons whose energy is in the IR portion of the electromagnetic spectrum to electrons. Once converted, these electrons are removed from the structure and external circuits are used to convert the information obtained into signals that may be viewed on a standard television monitor. This reconstruction allows for an invisible IR image to be presented in a manner that can be understood by an observer.

The infrared spectrum is considered to extend from just above the visible band (0.4 to 0.7 $\mu$m) out to more than 30 $\mu$m. Detectors can be fabricated from many materials that will respond to photons in the 1 to 30 $\mu$m spectrum. They are usually characterized by having a spectral response that is defined by the electronic band structure of the material. The structure allows for infrared detection to occur over a specific band of wavelengths. If a new wavelength band is desired, then a new material must be manufactured. There are no materials that are easily tunable by external means during operation after having been fabricated.

The task of providing a voltage tunable Schottky diode infrared detector is alleviated, to some extent, by the systems disclosed in the following U.S. Patents, the disclosures of which are incorporated herein by reference:

U.S. Pat. No. 4,533,933 issued to Pellegrini et al;
U.S. Pat. No. 6,319,204 issued to Wong, and
U.S. Pat. No. 5,107,317 issued to Takasaki.

The patent to Takasaki discloses the use of a Ge-containing crystalling layer as an intervening layer between an GaAs layer and a compound semiconductor layer. The Wong patent is of similar interest.

While the above-cited references are instructive, none of the cited patents disclose a Schottky diode infrared detector with a voltage tunable cutoff wavelength which is obtained by inserting a SiGe layer between the metal suicide and the Si substrate.

SUMMARY OF THE INVENTION

The invention includes a Schottky diode infrared detector with a voltage tunable cutoff wavelength. The tunability is due to modification of the Schottky diode band diagram by insertion of a SiGe layer, with the approplate parameters, between the suicide and the Si substrate, making the detector a silicide/SiGe/Si Schottky diode detector. The SiGe/Si interface has a valence band offset that can be used to engineer the shape, or depth profile, of the Schottky barrier. The energy offset can be gradual or abrupt, depending on the grading of the Ge concentration in the SiGe layer. When the offset is abrupt, it can be thought of as an additional, higher energy barrier to photoemitted carriers if the SiGe layer is thin enough. Because this offset, gradual or abrupt, is designed to be deeper in the semiconductor than the normal Schottky barrier maximum, it is easily modified by an external applied voltage. The sensitivity and the range of tunability are defined by the SiGe thickness and Ge concentration, respectively.

This invention will greatly expand the use of Schottky barrier and other photoemissive infrared detectors by allowing them to be fundamentally altered with an external applied potential. Present technology does not provide for this augmentation and current detectors are capable of responding to wavelengths over a well defined spectral band. The tunability of contemporary detector diodes is very small and defined by well known physical relationships. The new detectors have a novel internal structure that allows for modulation of spectral response with an externally applied potential and it is simple because it does not require additional external connections.

It is an object of the invention to provide a voltage tunable cutoff in Schottky infrared detectors.

It is another object of the invention to provide tunability in detector diodes without an addition of new external connections.

These objects together with other objects, features and advantages of the invention will become more readily apparent from the following detailed description when taken in conjuction with the accompaning drawings wherein like elements are given like reference numerals throughout.

DESCRIPTION OF THE DRAWINGS

FIG. 6a is a valence band edge energy diagram for a detector of the present invention with higher doping levels and a thinner, graded composition SiGe layer;

DETAILED DESCRIPTION OF THE PREFERRED EMBODIMENT

The present invention is a Schottky diode infrared detector with a voltage tunable cutoff wavelength. The tunability is due to modification of the Schottky diode band diagram by insertion of a SiGe layer, with the appropriate parameters, between the silicide and the Si substrate, making the detector a silicide/SiGe/Si Schottky diode detector. The SiGe/Si interface has a valence band offset that can be used to engineer the shape, or depth profile, of the Schottky barrier. The energy offset can be gradual or abrupt, depending on the grading of the Ge concentration in the SiGe layer. When the offset is abrupt, it can be thought of as an additional, higher energy barrier to photoemitted carriers if the SiGe layer is thin enough. Because this offset, gradual or abrupt, is designed to be deeper in the semiconductor than the normal Schottky barrier maximum, it is easily modified by an external applied voltage. The sensitivity and the range of tunability are defined by the SiGe thickness and Ge concentration, respectively.

Figure 1:
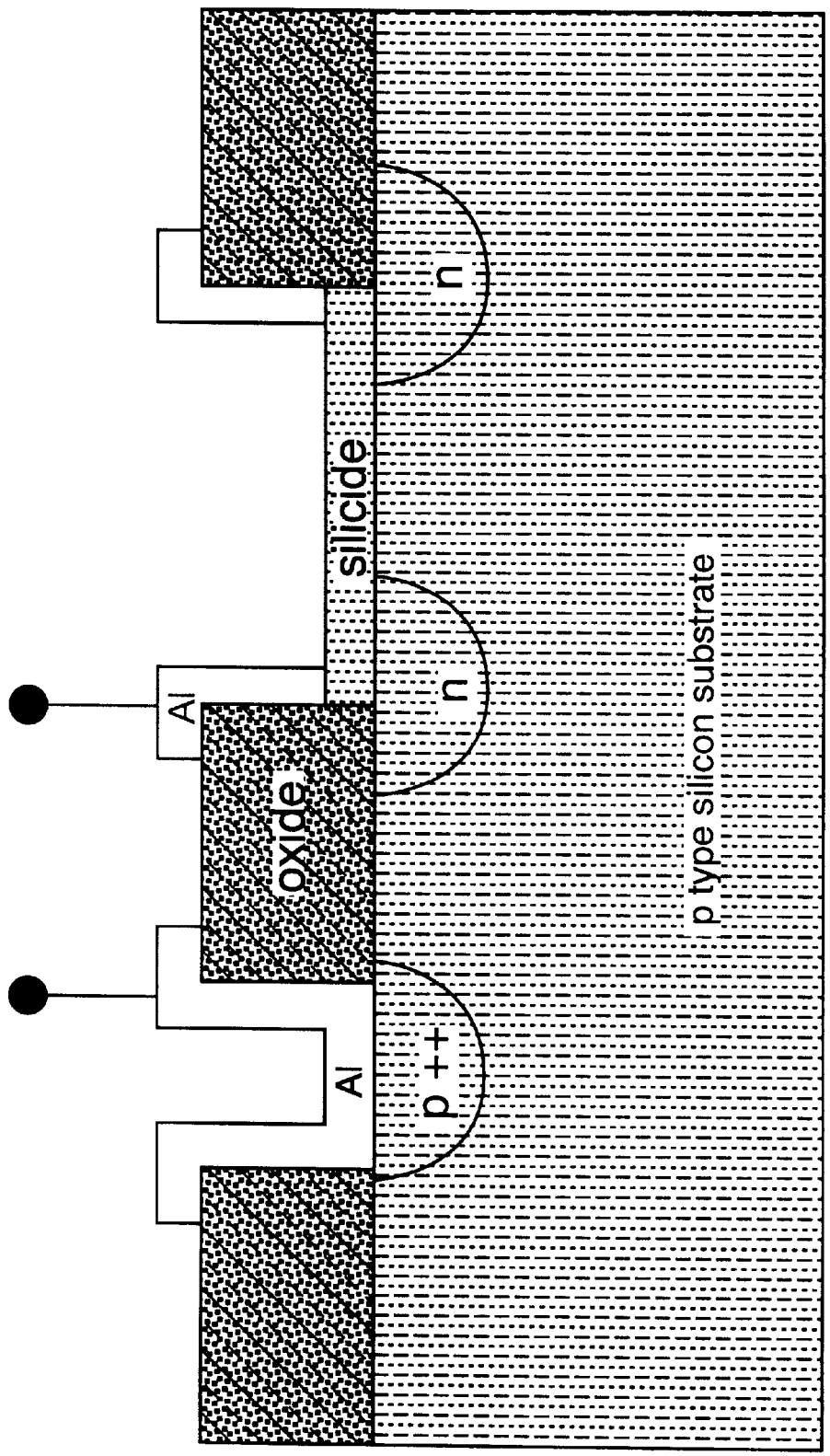
FIG. 1 is an illustration of a photoemissive infrared detector.

The discussion that follows describes a new method of creating a photoemissive detector on a silicon substrate that will allow for variation of the cutoff wavelength during operation. However, the invention need not be limited to silicon. Contemporary Schottky barrier diodes are easy to fabricate and require simple deposition of a metal onto a high quality silicon substrate. FIG. 1, shows the current state of the art for metal photoemissive device. The simplicity of manufacture is the main reason for the success of these devices. It is known that there is a limited ability to alter, or tune, the spectral response of these devices by applying a reverse bias potential.

Figure 2:
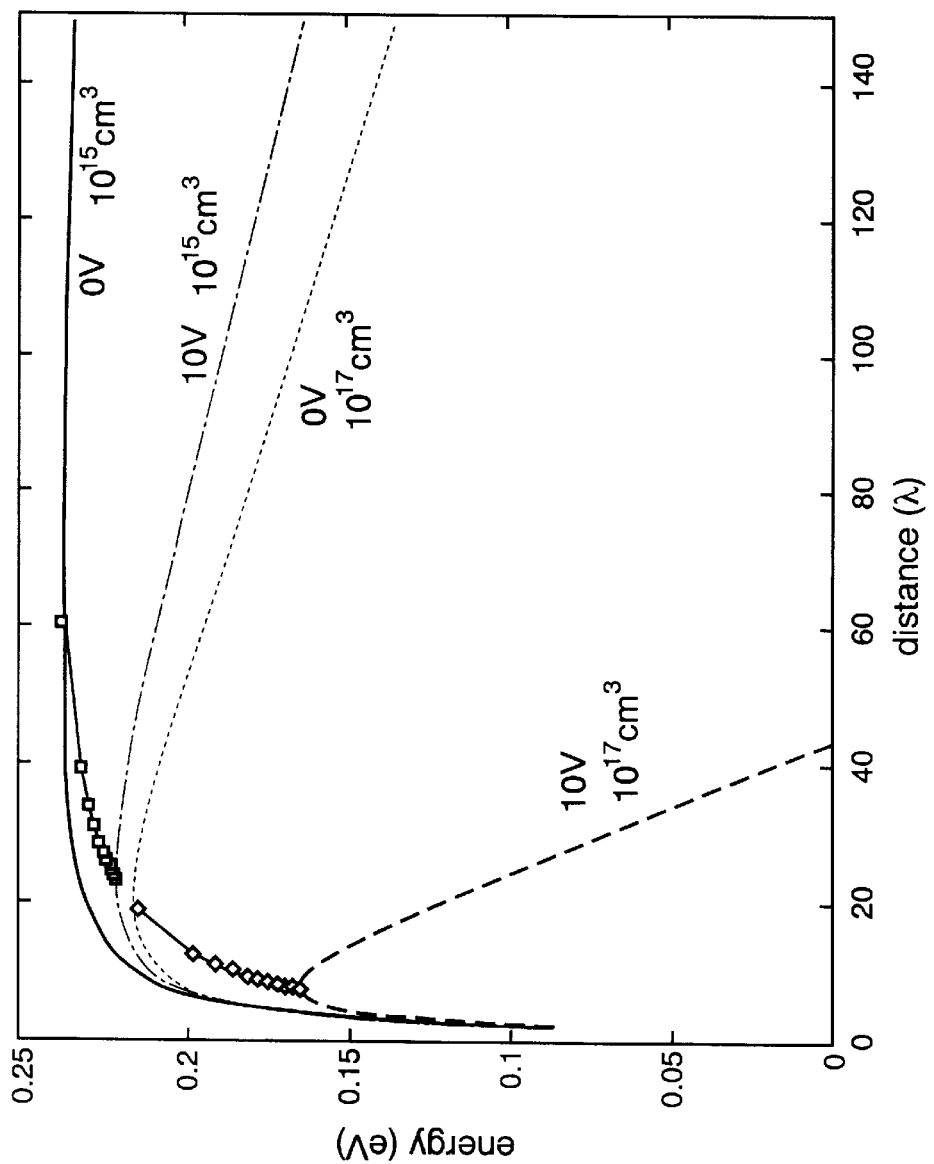
FIG. 2 is a plot of the valence band-energy for a standard silicide/Si Schottky diode for different doping levels and externalily applied voltages, with points showing the maxima at different external voltages.

FIG. 2 shows the electronic band diagram for this type of diode, with zero bias potential and with 10 volts bias potential. The variation of the valence band edge energy with distance, $E_v(z)$, is expressed in equation (1).

$$E_v(z, V) = -q\phi_{bo} + U(z, V) + \frac{q^2}{16\pi\epsilon_s z} \quad (1)$$

In this equation, the third term on the right hand side is the potential energy due to the image force, z is the distance in the semiconductor away from the metal, $\phi_{bo}$ is the asymptotic value of the Schottky barrier, i.e., the value of the Schottky barrier in the absence of the image force, q is the magnitude of the electron charge, V is an externally applied bias voltage, and U(z) is the electrostatic potential energy due to the charge redistribution that occurs when the metal-semiconductor structure is formed. All energies in the equation are referred to a zero of energy at the Fermi level in the metal. U(z) is given by equation (2), $$U(z, V) = \frac{q^2 N_a}{\epsilon_s}\left[W(V)z - \frac{z^2}{2}\right] \quad (2)$$

where $N_a$ is the density of ionized acceptors, $\epsilon_s$ is the dielectric constant of the semiconductor, and W is the width of the semiconductor region that has been depleted of carriers by the charge redistribution. This depletion width, W, is given for diodes on p-type silicon by equation (3), $$qV_{bi} = q\phi_{bo} - [E_F - E_v^\infty] \quad (3)$$

where $V_{bi}$ is the electrostatic potential difference across the depletion region in the absence of an externally applied bias voltage, V is the externally applied bias voltage, T is the absolute temperature, and k is Boltzmann's constant. The built-in potential, $V_{bi}$, is given by equation (4), $$W(V) = \sqrt{\frac{2\epsilon}{qN_a}\left[V_{bi} + V + \frac{kT}{q}\right]} \quad (4)$$

where $E_F$ is the Fermi energy in the semiconductor and $E^\infty_v$ is the valence band-edge energy in the neutral region of the semiconductor. The position, $z_m$, of the maximum of the Schottky barrier profile defined by equation (1) is given by equation (5).

$$z_m(V) = \sqrt{\frac{1}{16\pi N_a W(V)}} \quad (5)$$

The Schottky barrier height, $\phi_b$, is found by substitution of equation (5) into equation (2), and is given by equation (6).

$$\phi_b(V) = \phi_{bo} - \frac{q}{2\epsilon_s}\sqrt{\frac{N_a W(V)}{\pi}} \quad (6)$$

The change in the barrier height with reverse bias, therefore, is given by equation (7).

$$\Delta\phi_b(V) = -\frac{q}{2\epsilon_s}\left[\frac{N_a}{\pi}\right]^{\frac{1}{2}}\left[\sqrt{W(V)} - \sqrt{W(V=0)}\right] \quad (7)$$

A sensitivity analysis of equations (6) and (7) shows that the fourth-root dependence of barrier potential on applied reverse bias is extremely weak. A variation in reverse bias of 0 to 10 volts results in 10% changes in $\phi_b$ or $\lambda_{co}$. These values are minor in infrared systems that require changes of 10 to 20 times those values. The reason that this change is so weak is that the position of the Schottky barrier maximum given by equation (5), is on the order of about 30–50 Å for PtSi/Si diodes at zero bias, which is very close to the metal-semiconductor interface. The externally applied potential difference falls across the whole depletion width, which is typically thousands of angstroms, so that points closer to the metal semiconductor-interface have less reduction in energy.

Figure 2A:
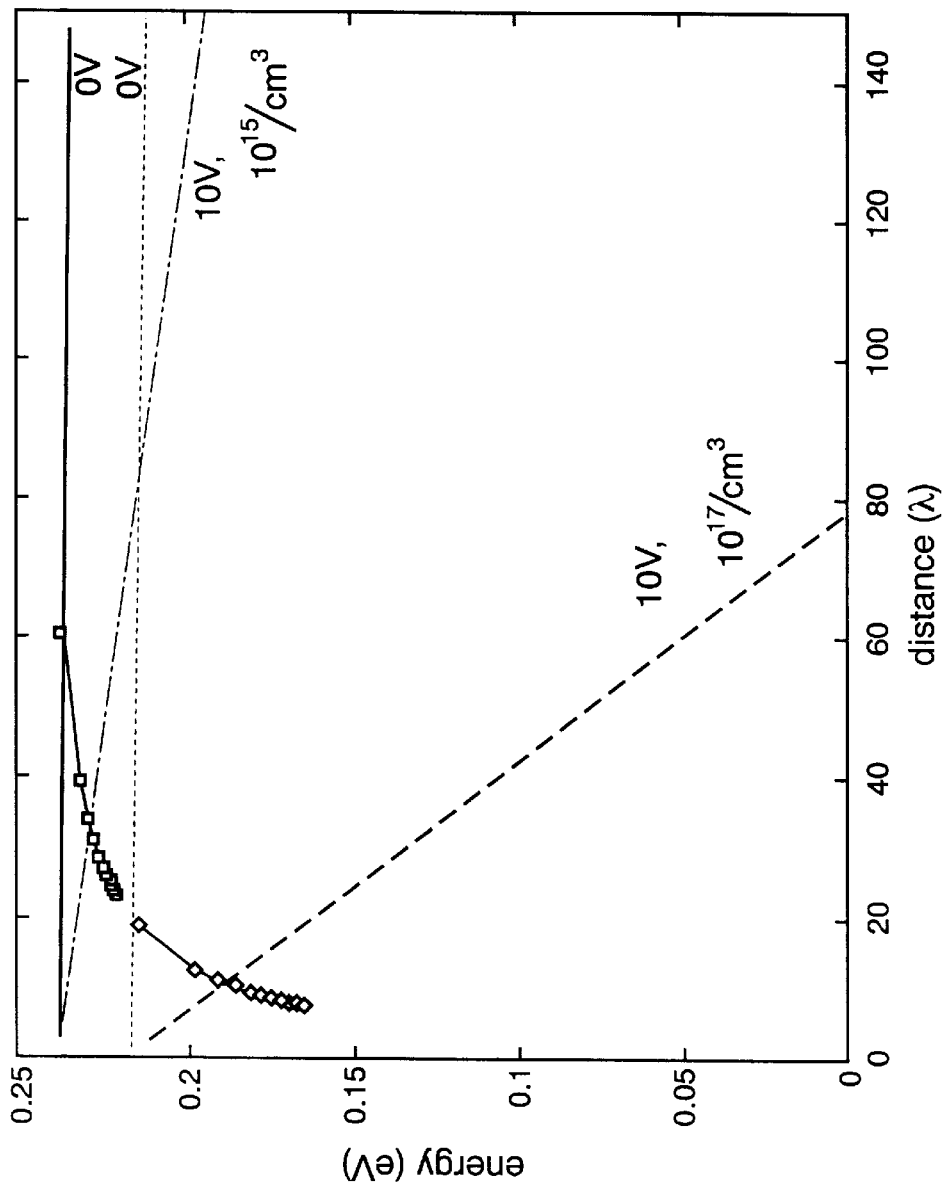
FIG. 2a is a plot of the externally applied potential energy in a Schoaky diode together with the maxima of the Schottky barrier at different voltages.

FIG. 2a clarifies this voltage dependence and points the way toward increasing it to obtain a voltage-tunable cut-off wavelength detector. The figure contains the potential energy due to the externally applied bias. The entire potential difference falls across the depletion region, and the externally applied potential energy is a straight line across this depletion region. FIG. 2a shows how the change in the barrier height with bias could be increased if, for a given doping level the position of the peak were deeper in the semiconductor, i.e., further away from the metal. This can only be obtained by changing the shape, or band diagran, of the Schottky barrier, i.e., engineering the semiconductor characteristics in the depletion region.

This discussion shows how to engineer the Schottky band diagram, and profoundly alter the characteristics of the Schottky barrier, by placing a thin layer of an alternate semiconductor material between the silicon substrate and the metal silicide (i.e. metal-like) layer. The simplest and most compatible band-altering material for silicon is an alloy of silicon and germanium denoted as $Si_{1-x}Ge_x$. The value of x shows the percentage of germanium to be found in the alloy, and the alloy will be denoted as SiGe for the sake of brevity in the following text. SiGe alloys are grown on silicon substrates by a variety of epitaxial techniques, such as Molecular Beam Epitaxy (MBE) or any one of many variants of Vapor Phase Epitaxy (VPE) or Chemical Vapor Deposition (CVD). There is a mismatch between the lattice spacing of these two materials and a strain exists when the layer is formed. If the layers are made thick, the strain is relieved by relaxation creating dislocations. In the structures used here, the layers were kept thin enough to have fully strained devices and no dislocations were allowed.

Figure 3:
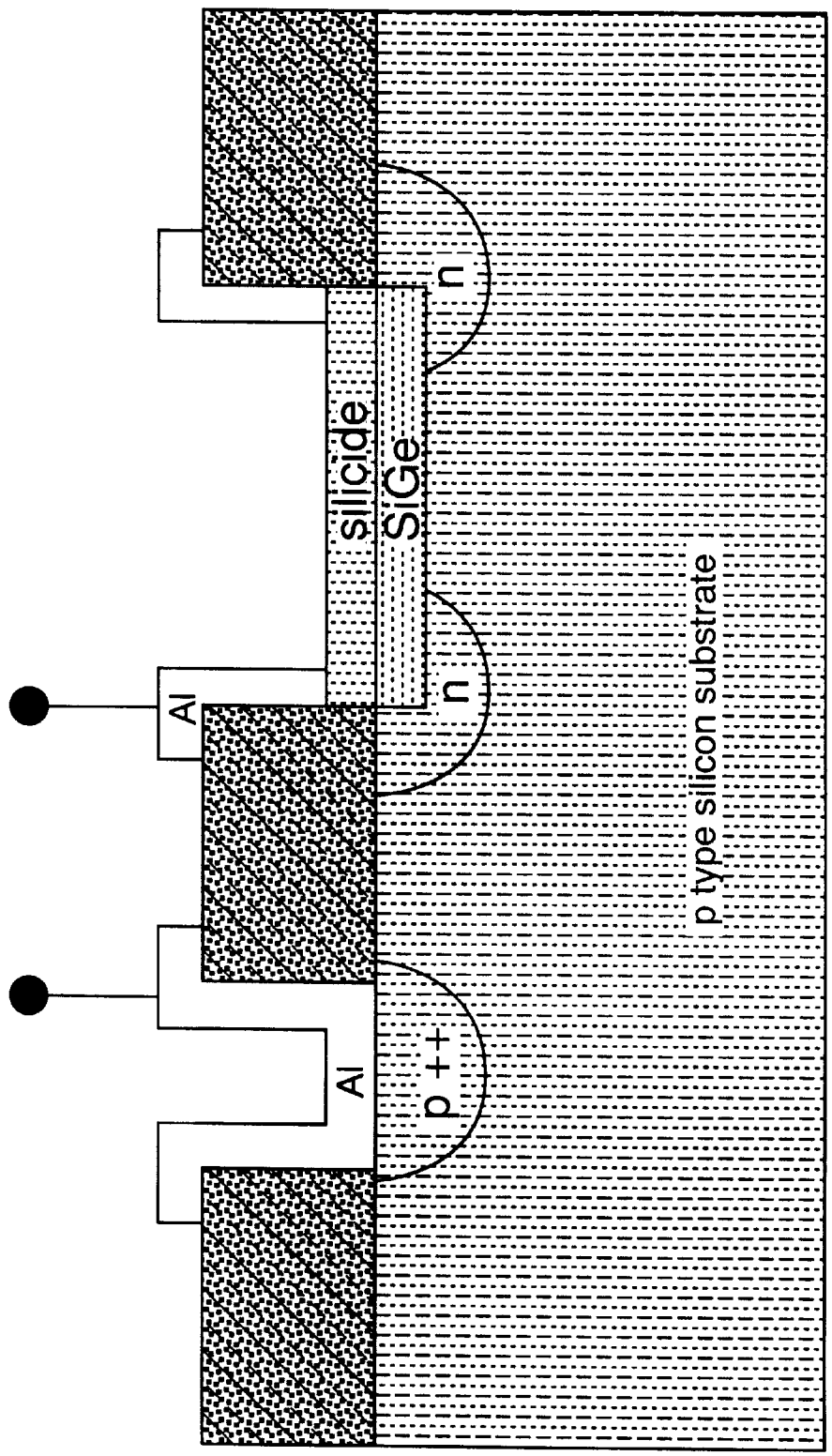
FIG. 3 is an illustration of the preferred embodiment of the voltage tunable photoemissive infrared detector of the present invention.
Figure 4:
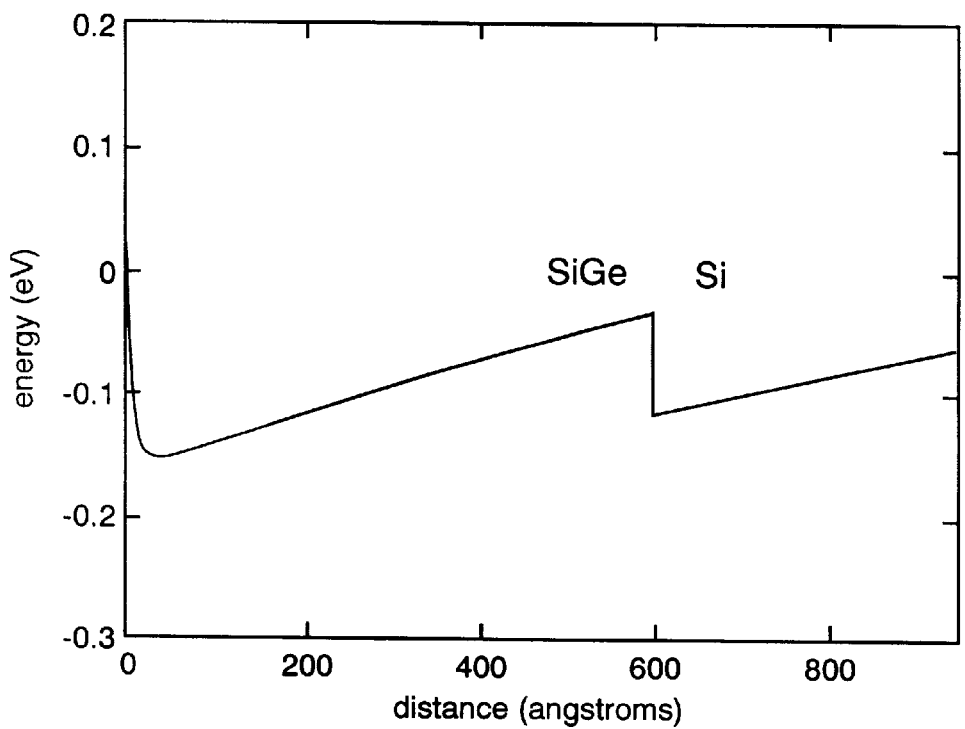
FIG. 4 is the valence band energy diagram for a silicide/SiGe/Si Schottky diode with a thick SiGe layer.

FIG. 3 shows the physical structure that was grown for the new voltage tunable cutoff wavelength devices. The structure is the same as that of a standard Schottky photoemissive devices in every way except for the replacement of a portion of the Si substrate below the metal layer by a SiGe alloy layer. The interposed SiGe alloy layer is between the active photocathode and the original silicon substrate. The guard ring that was originally in the Si substrate extending to its surface must now extend through the SiGe layer up to its surface as well. The thickness, position and impurity concentration of this layer will dramatically affect the characteristics of the new voltage tunable devices. The band structure of the SiGe alloy is different from that of the silicon layer and that fact also is used to alter the tunability of the detector. A typical band structure diagram of the new diode is shown in FIG. 4 with the corresponding potential energy function drawn beneath it. In this diagram, the SiGe layer is 600 Å thick, so that the band offset occurs abruptly at 600 Å. The dashed line is what would occur if the Ge concentration were graded gradually and linearly to zero at 600 Å, starting at 200 Å. It is seen that the placement and thickness of the band structure altering SiGe layer are important in this structure.

Figure 5:
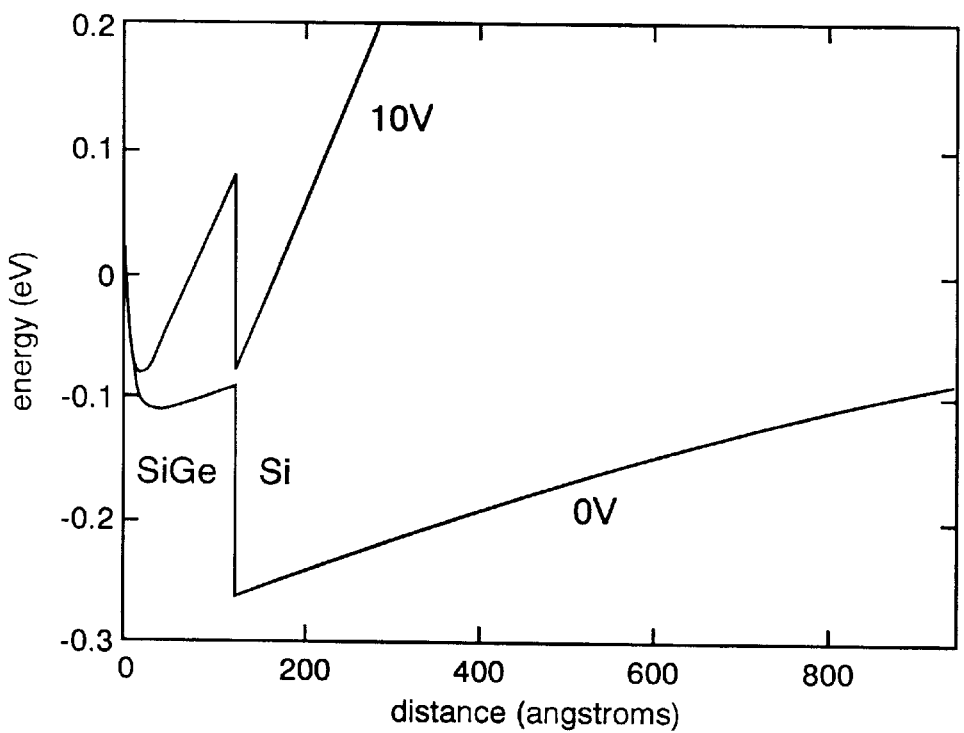
FIG. 5 is the valence band edge energy diagram for the present invention.

The diode shown in FIG. 4 is still not tunable because the SiGe layer is too thick. At zero applied bias, the peak that occurs at the SiGe/Si interface is lower than that of the SiGe/PtSi interface. An increase in the reverse bias potential in this case will simply pull the potential down further and the barrier is still defined by the metal/SiGe interface. Now consider what would happen if the SiGe layer were made much thinner. FIG. 5 shows the energy band diagrams for a SiGe layer that is 120 Å thick at two different reverse bias potentials. At zero bias, the barrier to hot carriers is located at the SiGe/Si interface. As the bias is increased, the peak in the potential is seen to be much more affected than in the case of standard diodes. This is because the peak is deeper in the semiconductor. When the reverse bias is at 10 volts, the barrier is defined by the SiGe/PtSi interface and the rapid tunability of the diode ceases. At voltages greater than 10 volts, the standard variation of $V^{0.25}$ occurs. Again, the dashed line shows the band diagram that would result if the Ge concentration were gradually reduced to zero. Only the position of the SiGe/Si interface, as defined by where the Ge concentration reaches zero, determines the height of the barrier, and not the details of the grading. However, the grading can be used to fine tune the barrier profile and prevent the undesirable effects of abrupt offsets.

During the time that the device is tunable, the diode's barrier potential varies because of the band discontinuity that is created by the added SiGe layer having a different electronic band structure. The expression for this variation is obtained by first looking at the standard Schottky diode and then adding the effects of the new band altering layer. In the standard Schottky barrier structure, the electrostatic potential varies with distance away from the metal semiconductor interface. In the structures reported here, the barrier potentials that yield infrared diodes require p-type silicon doping and conduction in the valence band. SiGe alloys also have the largest portion of their band offset contained in the valence band. This means that there can be a large variation or tunability using this structure.

In the new voltage tunable diodes, the valence band-edge energy is altered to reflect the changes caused by the valence band offset that occurs because of the band structure differences between the SiGe alloy and the silicon substrate. The valence band-edge energy is given by equation (8).

$$E_v(z, V) = E_v^i(z) + U'(z, V) + \frac{q^2}{16\pi\epsilon_s z} \qquad (8)$$

The superscript i in this equation is used to indicate the initial valence band diagram, or initial band profile, that includes the valence band offset, $\Delta E_v^x$, between the SiGe and the Si. The electrostatic potential energy $U'(z)$ is given by equation (9), $$U'(z, V) = \frac{q^2 N_a}{\epsilon_s} \left[ W'(V)z - \frac{z^2}{2} \right] \qquad (9)$$

which is of the same form as equation 2, except that W is replaced by W', which is given by equation (10).

$$W'(V) = \sqrt{\frac{2\epsilon}{qN_a} \left[ V'_{bi} + V + \frac{kT}{q} \right]} \qquad (10)$$

In this equation, $V'_{bi}$ is the built in potential associated with the asymptotic value $\phi_b^x$ and the offset $\Delta E_v^x$, and is expressed in equation (11).

$$qV'_{bi} = q\phi_{bo}^x + \Delta E_v^x - [E_F - E_v^\infty] \qquad (11)$$

The superscript x indicates that its value depends on the Ge composition x. If the SiGe layer is of uniform Ge composition, the initial valence band profile is given by equation (12), $$E_v^i(z) = \begin{cases} -q\phi_{bo}^x & z < z_{int} \\ -q\phi_{bo}^x - \Delta E_v^x & z > z_{int} \end{cases} \qquad (12)$$

where $z_{int}$ is the position of the SiGe/Si interface, i.e., the thickness of the SiGe layer, and $q\phi_{bo}^x$ is the asymptotic value of the Schottky barrier height of the silicide/SiGe contact. The Ge composition of the SiGe layer can be smoothly decreased to zero over a portion of the thickness of the SiGe layer. If this is the case, then the initial valence band profile is given by eqn. (13), $$E_v^i(z) = \begin{cases} -q\phi_{bo}^x & z < z_g \\ -q\phi_{bo}^x - f(z) & z_g \leq z \leq z_{int} \\ -q\phi_{bo}^x - \Delta E_v^x & z > z_{int} \end{cases} \qquad (13)$$

where $z_g$ is the thickness of the uniform portion of the SiGe layer of total thickness $z_{int}$, and f(z) is a function determined by the grading profile. For example, for a grading profile in which the Ge concentration is decreased linearly to zero from $z_g$ to $z_{int}$, then f(z) is given by equation (14).

$$f(z) = \frac{\Delta E_v^x}{z_{int} - z_g} [z - z_g] \qquad (14)$$

For reverse biases such that the valence band at the SiGe/Si interface is of greater energy than the valence band at the Schottky barrier peak position given by equation (5), the effective barrier height, $\phi_{eff}$, is simply the value of the valence band energy at the SiGe/Si interface, referred to the metal Fermi energy, as expressed in equation (15).

$$-q\phi_{eff} = E_v(z_{int}) \qquad (15)$$

Writing this out explicitly gives equation (16), $$q\phi_{eff} = -U'(z_{int'}W'(V, V'_{bi}(\phi^x_{bo}, \Delta E^x_v))) + \qquad (16)$$

$$\frac{q^2}{16\pi\epsilon z_{int}} + q\phi^x_{bo} + \Delta E^x_v + \epsilon_{loss}$$

where $\epsilon_{loss}$ is a term that must be included because the expected energy loss of carriers from scattering in the SiGe will result in an effectively higher threshold energy for hot carriers from the metal. This energy loss is depicted schematically in FIG. 5. The energy loss scattering mechanism must have low momentum transfer so that carriers are not redirected away. A likely mechanism is therefore optical phonon scattering from the three optical modes in SiGe (Si—Si, Ge—Ge, and Si—Ge).

The difference between the effective barrier height at zero bias voltage and at nonzero bias voltage gives the bias dependence of the effective barrier height, as expressed in equation (17).

$$\Delta\phi_{eff} = -\frac{q}{\epsilon_s}N_a[W(V) - W(V=0)]z_{int} \qquad (17)$$

Figure 6:
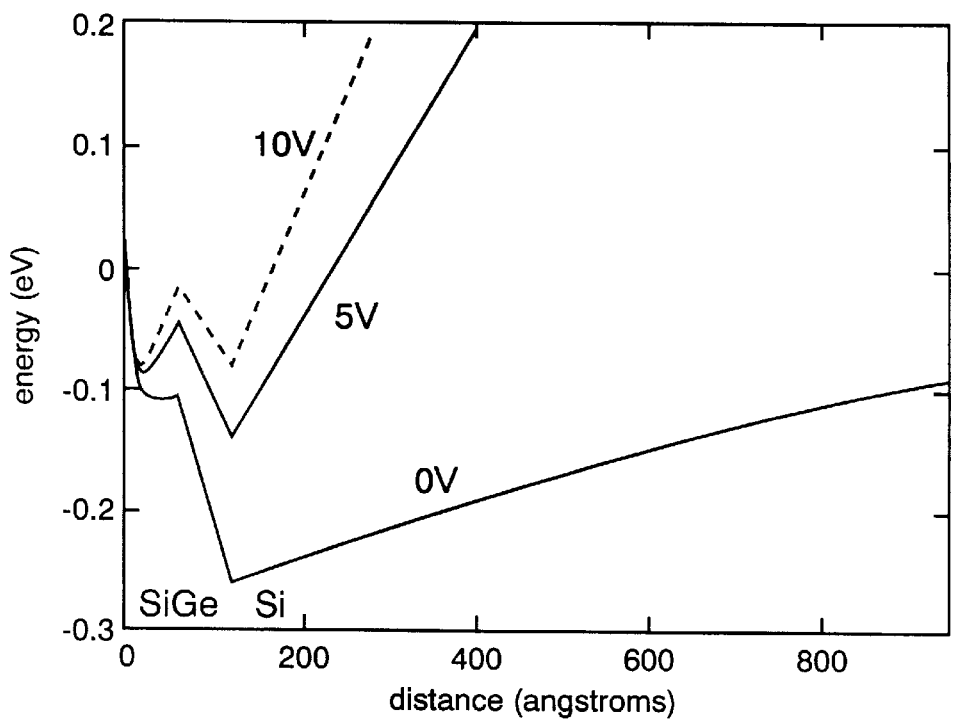
FIG. 6 is a valence band edge energy diagram for a detector of the present invention with a graded composition SiGe layer.

Equation (17) holds for reverse biases from zero up to a bias such that $\phi_{eff}$ becomes less than $\phi_b$. For reverse biases greater than this, the barrier height is that of the normal Schottky diode. Because the change in the effective barrier height has a linear dependence on W, it varies as the square root of the reverse bias, as opposed to the fourth root for normal Schottky diodes. This is represents a significantly enhanced tunability. Furthermore, because of the dependence on the SiGe interface position $z_{int}$ expressed in equation (17), the degree of tunability can be determined during manufacture by the choosing the SiGe thickness. FIG. 5 shows calculated results of equations (8), (9), (10), (11), and (12) for a zero bias and at 10 volts bias, for a diode with a SiGe thickness of 120 Å, and a Ge composition of 20%. Note that for the conditions chosen in this analysis, the tunability of the diode goes from 0 volts to some voltage between 5 and 10 volts. The barrier potential changes from about 0.25 eV to about 0.10 eV yielding a wavelength tunable range of 5.0 µm to 12 µm with this voltage swing. FIG. 6 shows how the band profile is changed by grading the Ge composition of the SiGe layer while keeping its thickness the same. The grading has the beneficial effect of reducing the strain in the SiGe layer and increasing the scattering length of carriers crossing the SiGe. It can also prevent anomalous tunneling effects in structures of the type shown in FIG. 5 at 10 volts, where a double-peak type of structure results if grading is not present.

The characteristics of the new tunable-cutoff diodes can be optimized with other detector characteristics, such as quantum efficiency, by choosing parameters such as the thickness of the SiGe layer, the Ge concentration and grading, and the doping level in the depletion region, which includes the entire SiGe layer and a portion of the Si substrate. For instance, it is known that the quantum efficiency of Schottky diodes is related to the distance that photoexcited carriers have to travel to the SchottAcy barrier maximum. The position of the potential energy peak directly affects the quantum efficiency: when the peak is closer to the metal the quantum efficiency is higher because the photoexcited carriers have a shorter distance to travel without being scattered. However, when the peak is closer to the metal, the degree of tunability is reduced. This trade off between tunability and quantum efficiency can be alleviated to a considerable extent by increasing the doping level of the SiGe and the part of the Si. The thickness of increased-doping layer need only be as thick as the depletion region at the highest bias the tunability is designed for (i.e., the bias at which the tunability reverts to that of standard diodes). The highly-doped Si can be grown just before the SiGe layer, in the same chamber and by the same methods. FIG. 6a, for example, shows the calculated band diagram of a PtSi/SiGe/Si diode with the SiGe and Si doped to $10^{17}$ cm$^{-3}$, superimposed on the band diagrams of FIG. 2. The SiGe/Si offset peak is at the same position as the standard Schottky diode peak position. (The SiGe is linearly graded to avoid an abrupt offset.) At zero bias, therefore, the two diodes have the same quantum efficiency. However, the increased doping, together with the increased distance from the metal to the peak of the barrier, allows a much greater tunability in the barrier height of the PtSi/SiGe/Si diode, compared to the standard diodes.

The starting material is high quality, VLSI grade silicon, lightly doped p-type. The wafers are oxidized with a layer of $SiO_2$ to passivate the silicon surface and eliminate surface currents from contaminating the photo generated currents. Selected regions of the $SiO_2$ are etched away, and the exposed regions are made to be heavily doped p$^{++}$ to serve as a substrate contact. The $SiO_2$ on the active diode areas are etched away, and a layer of SiGe is formed on the active diode areas. The SiGe is formed by one of several methods, such as molecular beam epitaxy methods, chemical vapor deposition methods, or Ge ion implantation methods, all of which are known to researchers and have been published in the scientific literature. A thin "capping" layer of silicon can be grown over the SiGe if it is required by the silicide formation method to be used. Some methods can cause the selective formation of the SiGe only in the active diode areas. If the SiGe formation method used causes the SiGe layer to be formed over the entire wafer, including the oxide areas, the SiGe is etched away from all areas except the active diode areas. The $SiO_2$ is etched around the periphery of the detector area, and an n-type guard ring of phosphorus atoms is placed into this periphery. This structure acts to suppress edge leakage that may occur at the outer periphery of the diode because of the small radius of curvature of the photo sensitive area. The wafer is cleaned using standard wet chemical means and the wafer is place into an e-beam evaporator having an ultimate vacuum of less than $10^{-7}$ Torr.

The detector diodes are fabricated by causing a PtSi layer, or any other metal or metal-like layer, to be formed on the SiGe layer. One method by which this can be done is the simultaneous evaporation of silicon and the elemental metal, such as Pt, in the correct, stochiometric ratio of the final silicide compound. The fluxes of each evaporating beam are independently monitored and controlled, either by two separate quartz crystal monitors, or by optical methods such as electron-impact-emission-spectroscopy. In the method of simultaneous evaporation, the silicide forms on the SiGe without any interdiffusive solid-state reactions between the evaporated metal and the SiGe layer. Another method is to employ a sacrificial Si capping layer that has been previously formed on the SiGe. The metal is evaporated using onto the Si capping layer on the SiGe alloy. Platinum metal is evaporated using an electron beam because of its extreme refractory mature. The platinum starting material is of 99.99% purity or higher. The thickness of platinum metal is determined by using a quartz vibrating crystal monitor. The clean silicon surface is extremely reactive and a PtSi layer forms as soon as the Pt atoms hit the surface. The reaction is enhanced by heating the platinum coated surface to 350°

C. in-situ. The platinum thickness is made so that it consumes all of the protective silicon in a chemical reaction of Pt+Si→PtSi. The platinum that is evaporated on the $SiO_2$ portion of the wafer does not react and remains elemental Pt. After the wafer is removed from the e-beam evaporator, the Pt, or PtSi, depending on the method used, is removed from all areas except the active diode areas. Pt is washed in an aqua regia solution at 90° C. The PtSi is not effected but the Pt on the $SiO_2$ is selectively dissolved. The final step in detector diode fabrication is to place aluminum contacts onto both the substrate area ($p^{++}$ region) and the guard ring (n region). It is important not to place thick aluminum over the infrared sensitive PtSi region because the quantum efficiency of the device is degraded by thick metal layers.

The barrier potential of a Schottky infrared detecting diode can be measured by various means. These include forward I-V, C-V, thermal activation (Richardson) and photoemissive. The most effective characterization for an infrared detector is photoemissive, often referred to as the Fowler plot. The Fowler method involves infrared illumination of the diode with photons in a manner similar to that of a device in actual use. This method determines the efficiency of carrier emission of the infrared diode and gives the barrier potential to infrared photons.

The quantum efficiency relationship is well known and is given by $$Y(E) = C_1 \frac{(E-\phi)^2}{E} \quad (18)$$

where Y is the quantum efficiency, $C_1$ is the Schottky emission constant, E is the energy of the incident photons, and $\phi$ is the barrier height, either the effective barrier height or the Schottky barrier height.

The Fowler function is made by linearizing equation (18) to get equation (19).

$$\sqrt{YE} = \sqrt{C_1}(E-\phi) \quad (19)$$

Figure 7:
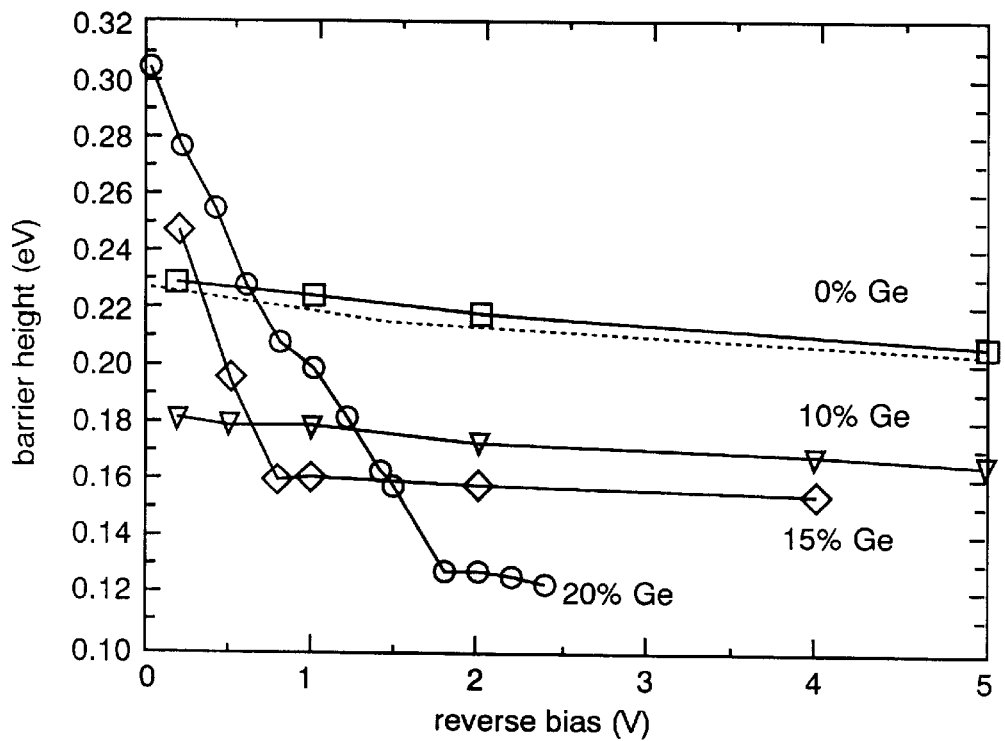
FIG. 7 is a chart of barrier height variation of a tunable photoemissive detector.

The Fowler function of equation (19) is used to determine the voltage dependence of the barrier potential. The results are shown in FIG. 7. There are many parameters that can be varied in this metallurgical system to vary the barrier. The one that we chose to modulate was the percentage of germanium in the SiGe alloys layer. The structures used for these measurements had a constant layer thickness of SiGe. The 0% germanium (i.e. silicon substrate) follows the $V^{0.25}$ dependence as expected from equation (6). The voltage variation for the 10% SiGe alloy showed tunability over a very small voltage range then it follows the expected $V^{0.25}$ variability. The 15% and 20% SiGe alloys show large variation of $\phi$ with voltage and would make ideal candidates for tunable infrared detector diodes. The solid lines in the plots are fits using equation (16).

The tunable diodes described here offer a new dimension in infrared detectors. In the case of PtSi we have already shown via measurement in preliminary experiments that the cutoff wavelength can varied by a factor of more than 2 from 5.0 μm to 10.5 μm. The metallurgical system that was used in these initial experiments is more complex than a simple silicon substrate. The addition of strained SiGe alloys adds several parameters to the system that can be varied. This added complexity allows for the tunability and several other variables can be manipulated, such as the doping level in the SiGe alloy and the thickness of the SiGe alloy layer.

This discovery is completely general in that it does not have to be applied only to a silicon based system. It can be used with any other semiconductor system where bandgap alteration is allowed. The sole requirement is that there be a compatible layer. that can be grown on the substrate and has a band offset from the substrate. The layer must be thin enough to allow for the reverse bias voltage to dramatically move the energy bands.

When these detectors are used in large two dimensional arrays, they must be cooled to reduce thermal emission over the barrier. The cooling that must be used is for the lowest barrier that is anticipated during operation. In the case of the devices measured in these experiments, the cooling temperature must be less than 50° K. These devices can be fabricated in either of the two prevailing silicon technologies, i.e. monolithic or bump bonded. The multiplexers must be designed to work at the lowest temperature required by the detector diode. In the case of these experiments, switched MOS is needed rather than CCD'S.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A Schottky barrier infrared photovoltaic detector which outputs a detection signal which is adjusted by an externally applied voltage and which comprises:

a silicon substrate having a first and second surface;

a silicide layer placed on the first surface of the silicon substrate to form a detector which has a barrier height and which operates in an infrared portion of an electromagnetic spectrum by internal photoemission of holes over an electrical barrier, said detector outputting said detection signal in response to said internal photoemission;

a guard ring implanted in said silicon substrate, said guard ring surrounding the periphery of said silicide layer to block surface currents formed on said substrate and to eliminate edge effects;

a SiGe intermediate layer which is grown on the said first surface of the said silicon substrate before the growth of the silicide layer, said SiGe intermediate layer producing an interface with a valence band offset that serves as additional barrier to photoemitted carriers; wherein said SiGe intermediate layer has a thickness that is selected from a range of 10 to 800 angstroms; and first and second contact means for making ohmic contact with said silicide layer and with said silicon substrate respectively, said first and second contact means conducting said externally applied voltage to said detector and outputting said detection signal.

2. A Schottky barrier infrared photovoltaic detector, as defined in claim 1, wherein said SiGe intermediate layer has a Ge concentration selected from a range of 1%–40%.

3. A Schottky barrier infrared photovoltaic detector, as defined in claim 2, wherein said SiGe intermediate layer has a thickness selected from a range of 40–120 angstroms.

4. The Schottky barrier photovoltaic detector of claim 3 wherein said first and second contact means are each formed of aluminum.

5. The Schottky barrier photovoltaic detector of claim 4 wherein said guard ring is formed of n-type dopant material.

* * * * *